United States Patent [19]

Tzeng

[11] Patent Number: 4,482,824
[45] Date of Patent: Nov. 13, 1984

[54] TRACKING ROM DRIVE AND SENSE CIRCUIT

[75] Inventor: Chin-Pyng J. Tzeng, Placentia, Calif.

[73] Assignee: Rockwell International Corporation, El Segundo, Calif.

[21] Appl. No.: 397,648

[22] Filed: Jul. 12, 1982

[51] Int. Cl.³ .................... H03K 5/153; G11C 7/06
[52] U.S. Cl. ............................ 307/530; 307/468; 307/297; 365/104; 365/196; 365/208; 365/226
[58] Field of Search ............... 307/530, 362, 363, 465, 307/468, 297, 270, 279; 365/103, 104, 96, 195, 196, 206, 207, 208, 211, 212, 226

[56] References Cited

U.S. PATENT DOCUMENTS

| | | | |
|---|---|---|---|
| 3,573,504 | 4/1971 | Breuer | 307/297 X |
| 3,626,393 | 12/1971 | Call | 365/195 X |
| 3,947,828 | 3/1976 | Meijer | 365/211 X |
| 4,179,626 | 12/1979 | Oehler | 307/362 X |
| 4,215,282 | 7/1980 | Brown et al. | 307/530 X |
| 4,339,809 | 7/1982 | Stewart | 365/106 |
| 4,347,476 | 8/1982 | Tam | 307/297 X |
| 4,399,375 | 8/1983 | Sempel | 307/297 |

OTHER PUBLICATIONS

Heimeier et al., "Temperature-Compensated on Chip Power System", IBM Tech. Discl. Bull., vol. 25, No. 2, Jul. 1982, pp. 643-644.

Dobkin, "Monolithic Temperature Sensor", Electronic Engineering Times, p. 12, 2/25/74.
Cole, "Temperature Transducter is Monolithic", Electronics, p. 148, Oct. 16, 1975.

Primary Examiner—Larry N. Anagnos
Assistant Examiner—David R. Bertelson
Attorney, Agent, or Firm—H. Fredrick Hamann; James F. Kirk

[57] ABSTRACT

A tracking ROM drive and sense circuit for use on a monolithic integrated circuit for driving a ROM, the ROM having a ROM input terminal and a ROM output terminal. The invention circuit comprises a sense amplifier having an input terminal coupled to the ROM output terminal and a drive circuit having an output terminal coupled to the ROM input terminal. The sense amplifier provides an output signal at a sense amplifier output terminal in response to a ROM output signal voltage at the sense amplifier input terminal as the ROM output signal penetrates a predetermined sense amplifier threshold voltage. The drive circuit has an amplifier that is essentially identical to the sense amplifier. The drive circuit provides a drive voltage to bias the midpoint of the ROM output signal voltage to track the threshold of the sense amplifier threshold in a sense amplifier threshold voltage, temperature dependent, voltage source dependent and process dependent, change accommodating relation. The drive circuit also includes a voltage divider network and an output driver FET.

10 Claims, 3 Drawing Figures

TRACKING ROM DRIVE AND SENSE CIRCUIT

BACKGROUND OF THE INVENTION

1. Field of the Invention

This invention relates to integrated circuits, and particularly to metal oxide semiconductor large scale integrated circuit (MOS/LSI) devices having n-channel or p-channel MOS field effect transistors, such as are commonly used in hand calculators, home and office computers, automotive and industrial control systems, games, and other commercial products. MOS/LSI devices are numerous circuit designs to achieve specific functions. One of the circuit designs used in MOS/LSI devices is a ROM drive and sense circuit, i.e., a circuit which provides an output signal having a first or second logic level in response to the selection of a memory cell in a read only memory (ROM). A ROM drive and sense circuit designed for use in MOS/LSI devices should be relatively insensitive to variations in supply or input voltage, process variations and variations in temperature. The invention circuit provides these features and is particularly suitable for manufacture by standard integrated circuit processing steps.

2. Description of the Prior Art

The most common ROM drive and sense circuit used in MOS/LSI device design consists of a drive for the ROM provided by a connection to the voltage source $V_{DD}$ and a sense amplifier consisting of a simple inverter circuit consisting of a pull up depletion mode field effect transistor (FET) and a pull down enhancement mode FET for amplification of the ROM output signal supplied to the gate of the enhancement mode FET. The output of the ROM is a signal having a first logic level having a value relatively close to $V_{DD}$ and a second logic level, in response to the selection of a memory cell, having a value below the threshold of the sense amplifier inverter circuit.

An increase in the applied voltage source $V_{DD}$ typically results in an increase in the voltage values associated with the ROM output signal first logic level and a ROM output signal second logic level. An increase in the voltage value associated with a ROM output signal second logic level in the absence of other compensating effects, results in a decrease in the voltage difference between the sense amplifier threshold and the ROM output signal second logic level voltage. A decrease in this voltage difference is a reduction in the design margin of the sense amplifier operating in combination with the ROM. Correspondingly, voltage source variations and temperature variations may act separately or in combination to change the sense amplifier threshold thereby decreasing the sense amplifier design margin.

Prior art designs typically rely on large ROM output signal transitions from a first logic level to a second logic level to enhance sense amplifier signal margin. A ROM designed to provide a large voltage swing on its output signal in response to selection of a memory cell does so at the cost of larger geometry memory cells and correspondingly fewer number of memory cells for a given device size. An additional disadvantage associated with a large swing ROM output signal is that more time is required to both charge and discharge the capacitance present on the ROM output signal bus. The additional time required to both charge and discharge the added capacitance results in the added penalty of slower memory access time.

SUMMARY OF THE INVENTION

It is a major objective of this invention to provide a tracking ROM drive and sense circuit for use in MOS/LSI devices, using relatively few components and being relatively insensitive to voltage source $V_{DD}$ variation, temperature variation and process induced variation. Another objective of this invention is to provide a tracking ROM drive and sense circuit that operates with a reduced ROM output signal swing range, thereby requiring shorter charge and discharge times to reach and exceed the sense amplifier threshold voltage. This reduction in charge and discharge time results in increased memory speed.

Another objective of this invention is to provide a tracking drive circuit to compensate the supply voltage to the ROM input for changes in voltage source $V_{DD}$.

These and other objectives of the invention are realized in a tracking ROM drive and sense circuit adapted to operate between a voltage source and a reference potential, such as ground and being further adapted to drive and sense a ROM. The ROM to be driven and sensed has a ROM input terminal, a ROM output terminal, a bias means interposed between the ROM input terminal and the ROM output terminal, and an array of selectable read only memory cells operating in parallel between the ROM output terminal and the reference potential. The ROM is adapted to provide an output signal at the ROM output terminal. The ROM output signal has a first and second logic level. The ROM is further adapted to switch the ROM output signal from a first logic level to a second logic level in response to a memory cell being selected. The ROM input terminal is adapted to receive a drive voltage. The ROM output signal first and second logic level voltages vary in temperature dependent and input drive voltage level dependent relation.

The tracking ROM drive and sense circuit comprises: a sense amplifier means having an input terminal coupled to the ROM output terminal. The sense amplifier means provides an output signal at a sense amplifier means output terminal in response to a ROM output signal voltage at the sense amplifier input terminal penetrating a predetermined sense amplifier threshold voltage, the sense amplifier means output signal being adapted to change from a first to a second logic level in response to the sense amplifier means threshold voltage being penetrated. The sense amplifier means threshold voltage is further adapted to change in a temperature dependent, voltage source and process dependent relation.

The invention tracking ROM drive and sense circuit further includes a drive circuit, the drive circuit having an output terminal coupled to the ROM input terminal. The drive circuit is further adapted to provide the drive voltage at the drive circuit output terminal, the drive circuit drive voltage being adapted to change in a sense amplifier means threshold voltage temperature dependent, voltage source dependent and process dependent change accommodating relation; whereby, the ROM, being responsive to the drive voltage, adapts the ROM output signal first and second logic level voltage range to accommodate the sense amplifier means temperature dependent threshold voltage change; thereby, improving sense amplifier means ROM output signal logic level detecting margin.

DESCRIPTION OF THE PREFERRED EMBODIMENT

Figure 1:
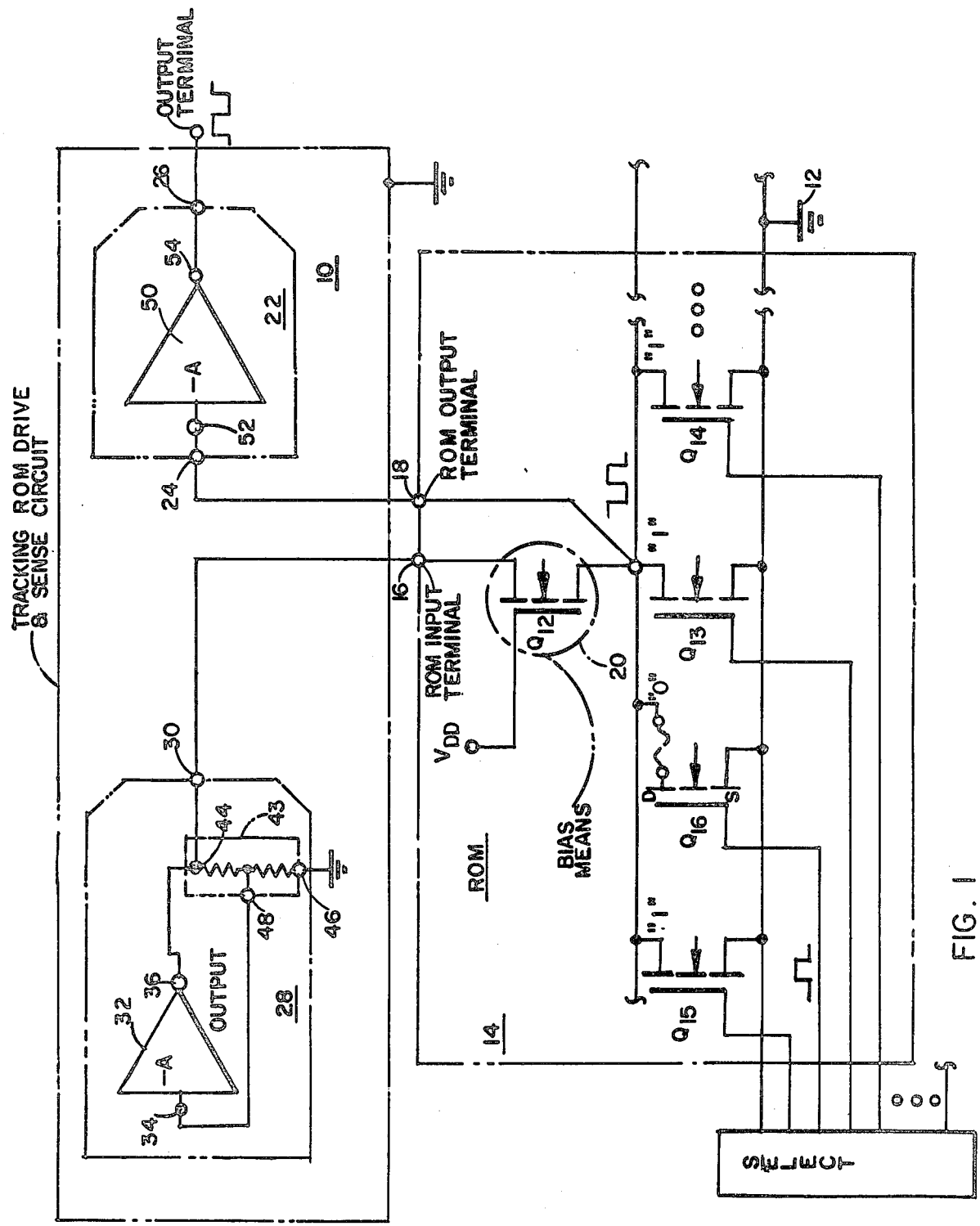
FIG. 1 is a block diagram and partial schematic illustrative of the invention tracking ROM drive and sense circuit depicting its interface connections to a typical ROM.

Referring to FIG. 1, tracking ROM drive and sense circuit 10 is depicted as being adapted to operate between a voltage source $V_{DD}$ and a reference potential, such as ground 12 and being further adapted to drive and sense a ROM 14 having a ROM input terminal 16, a ROM output terminal 18, a bias means 20 such as FET Q12, interposed between the ROM input terminal 16 and the ROM output terminal 18. The ROM also includes an array of selectable read only memory cells such as FETs Q13, Q14, Q15 and Q16 operating in parallel between the ROM output terminal 18 and the reference potential 12. The ROM is adapted to provide an output signal at the ROM output terminal 18, the ROM output signal having a first and second logic level. The ROM is further adapted to switch the output signal at ROM output terminal 18 from a first logic level to a second logic level in response to a memory cell being selected. The ROM input terminal 16 is adapted to receive a drive voltage. The ROM output signal first and second logic level voltages vary in temperature dependent and input drive voltage level dependent relation.

The tracking ROM drive and sense circuit 10 comprises: a sense amplifier means 22 having an input terminal 24 coupled to the ROM output terminal 18. The sense amplifier means 22 provides an output signal at a sense amplifier means output terminal 26 in response to a ROM output signal voltage at the sense amplifier input terminal 24 penetrating a predetermined sense amplifier means threshold voltage. The sense amplifier means output signal is adapted to change from a first to a second logic level in response to the sense amplifier means threshold voltage penetration. The sense amplifier means threshold voltage is further adapted to change in a temperature dependent, voltage source process dependent relation.

The ROM drive and sense circuit further comprises a drive circuit 28, the drive circuit 28 having an output terminal 30 coupled to the ROM input terminal 16. The drive circuit 28 is further adapted to provide the drive voltage at the drive circuit output terminal 30. The drive circuit drive voltage is adapted to change in a sense amplifier means threshold voltage, temperature dependent, voltage source dependent and process dependent change accommodating relation.

The ROM 14 being responsive to the drive voltage, adapts the ROM output signal first and second logic level voltage range to accommodate the sense amplifier means temperature dependent threshold voltage change, thereby improving sense amplifier means ROM output signal logic level detecting margin and thereby extending the ROM useful temperature range.

The drive circuit 28 further comprises a first inverting amplifier 32 having an input terminal 34 and an output terminal 36. A voltage divider network 43 is also included. The voltage divider network 43 has a sense terminal 44, a reference voltage terminal 46, and an output terminal 48.

The voltage divider network reference voltage terminal 46 is connected to the reference potential 12, i.e., ground. The voltage divider network output terminal 48 is connected to the inverting amplifier input terminal 34. The inverting amplifier output terminal 36 is connected to the drive circuit output terminal 30. The voltage divider network sense terminal 44 is connected to the drive circuit output terminal 30; whereby the drive circuit voltage is adapted to change in a sense amplifier means threshold voltage temperature dependent, voltage source dependent and process dependent change accommodating relation.

Sense amplifier means 22 further comprises: a second inverting amplifier 50 having an input terminal 52 connected to the sense amplifier means input terminal 24. The second inverting amplifier has an output terminal 54 connected to the sense amplifier means output terminal 26. The second inverting amplifier has a predetermined threshold voltage, the second inverting amplifier predetermined threshold voltage being initially adjusted in the absence of temperature change, voltage source change and process induced change. The predetermined threshold voltage is initially adjusted to a value approximating a mid point between the ROM output signal first logic level voltage and the ROM output signal second logic level voltage. For example, in the preferred embodiment, the second inverting amplifier predetermined threshold voltage is adjusted to approximately three quarters ($\frac{3}{4}$) the value of the predetermined ROM input voltage at the ROM input terminal 16. By selecting the relative sizes of the bias means 20 FET Q12 and the individual ROM cells such as FET Q13 the threshold voltage of the second inverting amplifier 50 is made approximately equal to the midpoint between the ROM output signal first logic level voltage and the ROM output signal second logic level voltage. The second inverting amplifier predetermined threshold voltage is subject to adverse sense amplifier means input signal margin reducing change in response to temperature change, voltage source change or process dependent change.

Figures 2, 3:
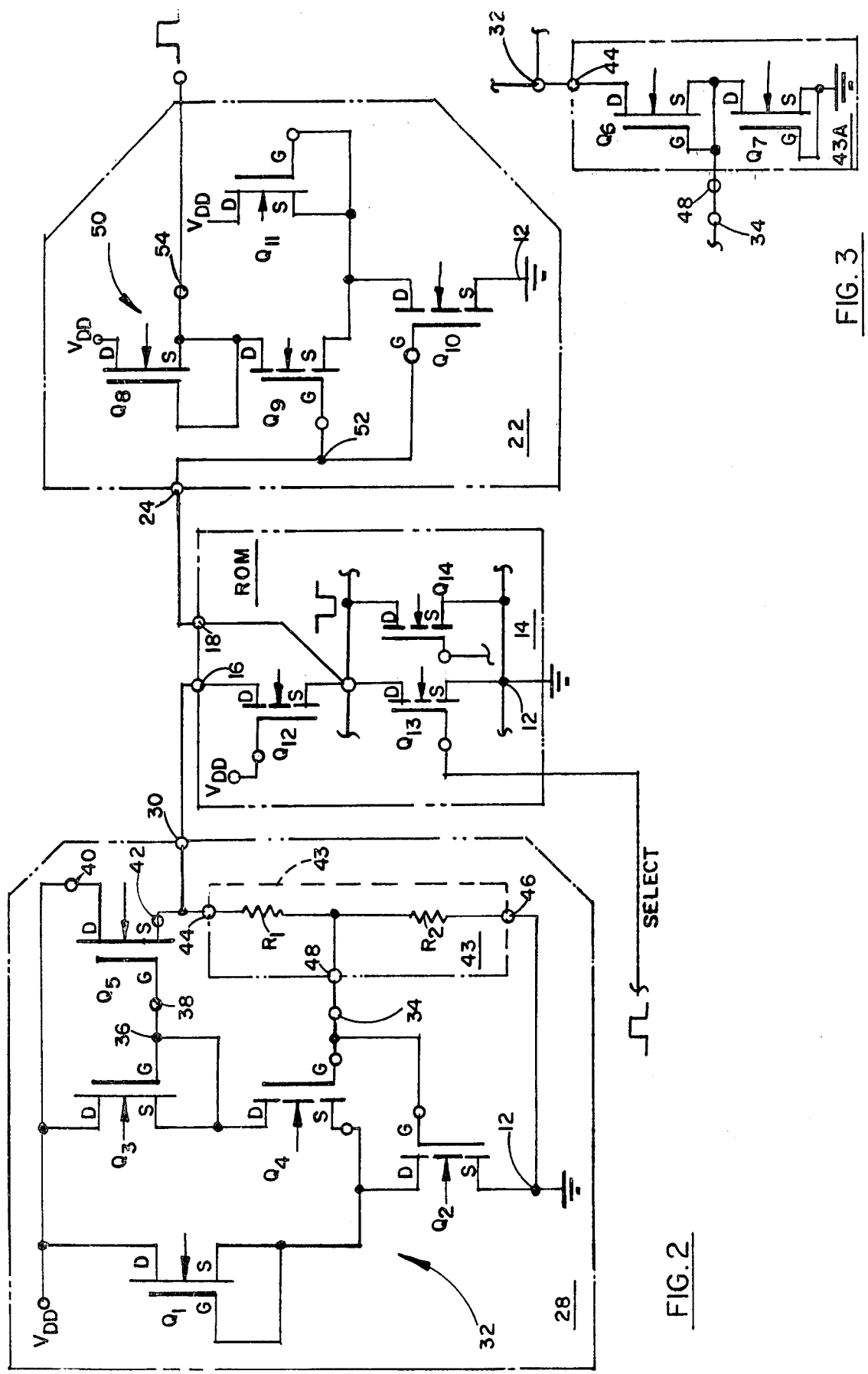
FIG. 2 is a detailed schematic of the preferred embodiment of the invention tracking ROM drive and sense circuit.
FIG. 3 is a detailed schematic of the preferred embodiment of a voltage divider network typically used in the invention ROM drive circuit.

Referring now to FIG. 2, the voltage divider network 43 depicted in drive circuit 28 is connected between drive circuit output terminal 30 and the reference potential 12. FIG. 3 depicts the preferred embodiment of the voltage divider network as 43A comprising: a sixth multiterminal semiconductor device Q6 and a seventh multiterminal semiconductor device, Q7.

Q6 is depicted as an n-channel depletion mode field effect transistor. The sixth multiterminal semiconductor device is depicted as an n-channel depletion mode field effect transistor Q6 having as a control grid, the Q6 gate G, the conduction channel first terminal being the Q6 drain D and the conduction channel second terminal being the Q6 source S.

The seventh multiterminal semiconductor device is depicted as n-channel depletion mode field effect transistor Q7 having as a control grid, Q7 gate G and as a conduction channel first terminal, drain D and as a conduction channel second terminal, source S. The sixth multiterminal semiconductor device conduction channel first terminal, Q6 drain D is connected to the voltage divider network sense terminal 44. The sixth multiterminal semiconductor device conduction channel second terminal, Q6 source S is connected to the sixth multiterminal semiconductor device control grid Q6 gate G, the seventh multiterminal semiconductor conduction channel first terminal, Q7 drain D and to the voltage reference divider network output terminal 34. The seventh multiterminal semiconductor device conduction channel second terminal, Q7 source S is connected to the seventh multiterminal semiconductor device control grid, Q7 gate G and to the voltage divider network reference potential 12.

The first inverting amplifier 32 further comprises: a first, second, third, and fourth multiterminal semiconductor device Q1, Q2, Q3 and Q4, each respective multiterminal semiconductor device having a control grid and a conduction channel having a first and second terminal. The first multiterminal semiconductor device is shown as n-channel depletion mode field effect transistor Q1, the gate G serving as a control grid, the conduction channel first terminal being drain D and the conduction channel second terminal being source S. The second multiterminal semiconductor device Q2 is depicted as an n-channel enhancement mode field effect transistor, the control grid being formed by gate G, the conduction channel first terminal by drain D and the conduction channel second terminal being source S. The third multiterminal semiconductor device Q3 is depicted as an n-channel depletion mode field effect transistor, the control grid being represented by gate G, the conduction channel first terminal being represented by drain D and the conduction channel second terminal being represented by source S. The fourth multiterminal semiconductor device Q4 is an n-channel enhancement mode field effect transistor, the control grid being represented by gate G, the conduction channel first terminal being represented by the drain D and the conduction channel second terminal being represented by the source S.

The first and third multiterminal semiconductor device conduction channel first terminals, Q1 drain D and Q3 drain D are connected to the voltage source $V_{DD}$. The first multiterminal semiconductor device condition channel second terminal, source S is connected to the first multiterminal semiconductor device control grid, gate G, to the fourth multiterminal semiconductor device conduction channel second terminal, Q4 source S and to the second multiterminal semiconductor device conduction channel first terminal, Q2 drain D.

The second multiterminal semiconductor device conduction channel second terminal, Q2 source S is connected to the reference potential 12. The second multiterminal semiconductor device control grid, Q2 gate G, is connected to the fourth multiterminal semiconductor device control grid, Q4 gate G, and to the first inverting amplifier input terminal 34, the fourth multiterminal semiconductor device conduction channel first terminal, Q4 drain D, being connected to the third multiterminal semiconductor device conduction channel second terminal, Q3 source S, to the third multiterminal semiconductor device control grid, Q3 gate G, and to the inverting amplifier output terminal 36.

The Q5 conduction channel first terminal 40 is connected to the voltage source $V_{DD}$. The Q5 conduction channel second terminal 42 is connected to the voltage divider network sense terminal 44. A fifth multiterminal semiconductor device Q5 is included having a conduction channel and a control grid 38, the conduction channel having first and second terminals 40, 42.

The first inverting amplifier 32 is adapted to amplify a signal voltage at its input terminal 34 from the voltage divider network output terminal 48 and provide an amplified inverted output signal at the first inverting amplifier output terminal 36 to the fifth multiterminal semiconductor device control grid, 38 Q5 gate G. The first inverting amplifier 32 is further adapted to compensate its output signal at the fifth multiterminal semiconductor device control grid, Q5 gate G, in a sense amplifier means threshold voltage temperature dependent, voltage source dependent and process dependent change accommodating relation.

The second inverting amplifier 50 further comprises: an eighth, ninth, tenth and eleventh multiterminal semiconductor device, such as Q8, Q9, Q10 and Q11. Each respective multiterminal semiconductor device has a respective control grid and conduction channel having a first and second terminal. The eighth multiterminal semiconductor device is n-channel depletion mode field effect transistor Q8 having a control grid represented by gate G, a conduction channel first terminal as drain D and a conduction channel second terminal as source S. The ninth multiterminal semiconductor device is -channel enhancement mode field effect transistor Q9 having a control grid represented by gate G, a conduction channel first terminal represented by drain D and a conduction channel second terminal represented by source S. The tenth multiterminal semiconductor device is depicted as n-channel enhancement mode field effect transistor Q10 having a control grid represented by gate G, a conduction channel first terminal represented by drain D and a conduction channel second terminal represented by source S. The eleventh multiterminal semiconductor device is represented by n-channel depletion mode field effect transistor Q11 having a control grid represented by gate G, a conduction channel first terminal represented by drain D and a conduction channel second terminal represented by source S.

The eighth and eleventh multiterminal semiconductor device conduction channel first terminals, the Q8 drain D and the Q11 drain D, are connected to the voltage source $V_{DD}$. The eighth multiterminal semiconductor device conduction channel second terminal, the Q8 source S, is connected to the eighth multiterminal semiconductor device control grid, the Q8 gate G, the ninth multiterminal semiconductor device conduction channel first terminal, the Q9 drain D and to the second inverting amplifier output terminal 54. Second inverting amplifier output terminal 54 is connected to the sense amplifier means output terminal 26.

The ninth multiterminal semiconductor device conduction channel second terminal, the Q9 source S is connected to the tenth multiterminal semiconductor device conduction channel first terminal, the Q10 drain D, to the eleventh multiterminal semiconductor device conduction channel second terminal, the Q11 source S and to the eleventh multiterminal semiconductor device control grid, the Q11 gate G.

The ninth multiterminal semiconductor device control grid, the Q9 gate G, is connected to the second inverting amplifier input terminal 52 and to the tenth multiterminal semiconductor device control grid, the Q10 gate G. The tenth muliterminal semiconductor device conduction channel second terminal, the Q10 source S, is connected to the reference potential 12. The second inverting amplifier input terminal 52 is connected to the sense amplifier means input terminal 24.

The second inverting amplifier predetermined threshold voltage is subject to adverse sense amplifier means input signal margin reducing change in response to temperature change, voltage source and process dependent change; the ROM output signal being adapted to change in a sense amplifier means threshold voltage temperature dependent, voltage source dependent and process dependent change accommodating relation.

The field effect transistors are insulated gate field effect transistors. Alternate preferred embodiments include those utilizing a negative voltage source $V_{DD}$ in relation to the reference potential 12 and employing p-channel insulated gate field effect transistors.

CIRCUIT OPERATION

The first and second inverting amplifiers 32, 50 are typically identical circuits formed on the same monolithic large scale integrated circuit. The threshold or trigger point is that voltage which when supplied to the respective inverting amplifier input 34, 52 causes the amplifier output signal at the respective inverting amplifier output 36, 54 to seek a voltage value approximating the mid point between a first logic level and a second logic level. Each respective inverting amplifier has a gain typically in excess of several hundred. A signal voltage that penetrates the threshold voltage of either inverting amplifier by more than twenty millivolts should be sufficient to drive the output signal of the amplifier to a full first or second logic level as the sense of the input signal above or below the operating point determines.

The first inverting amplifier, comprising Q1, Q2, Q3 and Q4 provides an output voltage at the first inverting amplifier output 36 to the Q5 gate G. The Q5 FET is connected to the load as a source follower and provides a drive voltage to drive circuit output terminal 30. In closed loop operation, the Q5 FET provides a relatively constant voltage at node 30. The voltage divider network formed by the R1 and R2 resistors senses the voltage at the drive circuit output terminal 30 and provides a fixed ratio of that voltage at first inverting amplifier input 34. The voltage at drive circuit output terminal 30 rises until the voltage at voltage divider network output 48 and correspondingly first inverter amplifier input 34 rises to the first inverting amplifier threshold voltage. As the signal at the first inverting amplifier input 34 begins to exceed the threshold voltage in a positive sense, the output voltage of the first inverting amplifier at first inverting amplifier output 36 drops in a negative sense causing a corresponding drop in the voltage applied to the voltage divider network at sense terminal 44. A reduction in the voltage applied to sense terminal 44 results in an immediate compensating reduction in the voltage at the voltage divider output terminal 48 and correspondingly at the first inverting amplifier input terminal 34; thereby, correcting for the preceding input signal exceeding the threshold in a positive sense.

The threshold of the first inverting amplifier is established by the threshold $V_{th}$ of the Q2 and Q4 FETs. The threshold of the second inverting amplifier 50 in the sense amplifier means 22 is correspondingly established by the threshold $V_{th}$ of the Q9 and Q10 FETs. The Q9 and Q10 FETs are typically formed in close proximity to the Q4 and Q2 FETs on the same MOS/LSI device to have identical thresholds, gains, and sensitivity to temperature and process variation. The threshold of each respective amplifier is established as the MOS/LSI device is formed in the absence of temperature variation and in the absence of process induced change since both devices are formed on the same MOS/LSI device using processes and geometries common to both at formation. A post formation change in the threshold voltage of the second inverting amplifier 50 as a result of a change in temperature is matched by a change in threshold voltage of the first inverting amplifier. Similarly, a change in the threshold voltage of the second inverting amplifier 50 induced by a change in the supply voltage $V_{DD}$ will be matched by an equivalent change in the threshold voltage of the first inverting amplifier 32, each respective inverting amplifier having identical threshold sensitivity with respect to change in voltage source voltage. Similarly, a change in the threshold voltage of the second inverting amplifier 50 induced by process changes as successive devices are manufactured, will be matched by an identical change in the threshold of the first inverting amplifier 32 since both amplifiers are formed on the same MOS/LSI device using the same process.

A principal object of the invention tracking ROM drive and sense circuit 10 is to maintain the threshold voltage of the second inverting amplifier 50 at a value approximating a mid point between the ROM output signal first logic level voltage and the ROM output signal second logic voltage. Referring again to FIG. 2, a typical ROM circuit 14 is illustrated having a plurality of memory cells, i.e., Q13 and Q14 connected to a common terminal 18 that serves as the ROM output terminal 18. Bias means 20 containing FET Q12 functions as a bias source to ROM output terminal 18. The ROM drive voltage is typically set to be 2.0 volts at ROM input terminal 16. FET Q12 and the ROM cells are sized so that the second logic level voltage at the ROM output terminal 18 is one volt, while the first logic level voltage is two volts.

ROM memory cells are typically programmed with a logic zero by removing a connection to a memory cell device such as the circuit break depicted in FIG. 1 where the drain of Q16 is shown to be disconnected. As a memory cell having a logic one programmed is selected, the selected memory cell is driven into conduction thereby shifting the voltage at the ROM output terminal 18 from a first logic level to a second logic level typically 1.0 volt above ground. As FET Q13 is selected the voltage at the ROM output terminal 18 drops, the FET Q12 and FET Q13 combination forming a divider network limiting the negative transition of the voltage at ROM output terrminal 18 as it drops to the second logic level. As individual memory cells are selected, the second logic level voltage realized at ROM output terminal 18 must drop far enough to penetrate the input threshold of the second inverting amplifier 50 at second inverting amplifier input 52. As the amplifier threshold changes, as a result of temperature change or voltage source change in a negative sense, the voltage difference between the second inverting amplifier threshold and the second logic level that can be reliably achieved at ROM output terminal 18 as a memory cell is selected is diminished thereby diminishing the design margin of the sensed signal.

A reduction in the threshold of the second inverting amplifier is accompanied by an identical reduction in the threshold of the first inverting amplifier. As the first inverting amplifier threshold is reduced, the first inverting amplifier 32 provides a lower voltage at the first inverting amplifier output terminal 36 and a correspondingly lower drive voltage at the drive circuit output terminal 30 to the ROM input terminal 16. The reduced voltage to the ROM input terminal 16 results in a correspondingly lower second logic level voltage at the ROM output terminal 18 as a result of the voltage divider formed by the Q12 and Q13 FETs. The reduced second logic level voltage obtained at the ROM output terminal 18 as a memory cell is selected compensates for the initial reduction in the threshold of the second inverting amplifier 50.

The use of a drive circuit 28 having a first inverting amplifier 32 adapted to track the input threshold variations of second inverting amplifier 50 enables the user of the invention tracking ROM drive and sense circuit 10 to bias the ROM drive voltage at the ROM input terminal to a relatively low value; thereby providing a ROM output signal having a relatively small voltage change between a ROM output signal having a first logic level and a ROM output signal having a second logic level. The output of the drive circuit at output terminal 30 is initially set to adjust the mid point of the voltage swing between a ROM output signal first logic level and a ROM output signal second logic level to approximately match the input threshold voltage of the second inverting amplifier 50. The second inverting amplifier 50 typically has an input threshold of approximately 1.5 volts. The drive voltage at drive circuit output terminal 30 is typically adjusted to 2.0 volts by adjusting the resistance values of resistors $R_1$ and $R_2$ shown in voltage divider network 43. $R_2$ is typically set such that $R_2$ is approximately equal to three times the value of $R_1$. The ROM output signal to the second inverting amplifier 50 from ROM output terminal 18 need only change approximately 1.0 volts in a positive or negative sense to penetrate the second inverting amplifier input threshold. The time required to traverse the 1.0 volt change is substantially less than the time required to change the several volts required in prior art configurations. The reduced time required to reach and penetrate the amplifier threshold permits a given ROM to be operated at a higher speed thus providing a user of the invention tracking ROM drive and sense circuit 10 with an additional advantage.

There is thus provided a tracking ROM drive and sense circuit 10 particularly useful in the design of MOS/LSI devices requiring relative insensitivity to voltage source $V_{DD}$ variation, temperature variation and process induced variation. The description provided is intended to be illustrative only and is not intended to be limitative. Modifications of the invention which fall within the purview of the description are intended to be included therein as well. The scope of this invention shall be determined from the scope of the following claims including their equivalents.

What is claimed is:

1. A tracking ROM drive and sense circuit formed on a monolithic integrated circuit and operating between a voltage source and a reference potential, such as ground and being coupled to drive and sense a ROM having a ROM input terinal; and a ROM output terminal, said ROM also having a ROM bias means interposed between said ROM input terminal and said ROM output terminal, and an array of selectable read only memory cells powered by said ROM bias means and operating in parallel between said ROM output terminal and said reference potential, said ROM providing an output signal at said ROM output terminal, said ROM output signal having a first and second logic level, said first and second logic level voltages characterizing a ROM output signal midpoint voltage substantially between said first and second logic levels, said ROM alternately switching said output signal between said logic levels through said ROM output signal midpoint voltage in response to each memory cell selection; said ROM input terminal receiving a drive voltage, said ROM output signal midpoint voltage being adjusted by adjustment of said drive voltage, said tracking ROM drive and sense circuit comprising:

a drive circuit, said drive circuit having an output terminal coupled to said ROM input terminal, said drive circuit having,
  a first inverting amplifier, having an output terminal connected to said drive circuit output terminal and an input terminal,
  a voltage divider network, said voltage divider network having a sense terminal, a reference voltage terminal and an output terminal,
  said voltage divider network sense terminal being connected to said drive circuit output terminal;
  said voltage divider network reference voltage terminal being connected to said reference potential, said voltage divider network output terminal being connected to said first inverting amplifier input terminal,
said first inverting amplifier having;
  first, second, third, and fourth multiterminal semiconductor devices, each respective multiterminal semiconductor device having a control grid and a conduction channel having a first and second terminal;
  said first and third multiterminal semiconductor device conduction channel first terminals being connected to said voltage source, said first multiterminal semiconductor device conduction channel second terminal being connected to said first multiterminal semiconductor device control grid, to said fourth multiterminal semiconductor device conduction channel second terminal and to said second multiterminal semiconductor device conduction channel first terminal,
  said second multiterminal semiconductor device conduction channel second terminal being connected to said reference potential, said second multiterminal semiconductor device control grid being connected to said fourth multiterminal semiconductor device control grid and to said first inverting amplifier input terminal,
said fourth multiterminal semiconductor device conduction channel first terminal being connected to said third multiterminal semiconductor device conduction channel second terminal, to said third multiterminal semiconductor device control grid and to said first inverting amplifier output terminal;
a sense amplifier means having an input terminal coupled to said ROM output terminal for providing an output signal at a sense amplifier means output terminal in response to said ROM output signal at said sense amplifier input terminal penetrating a predetermined sense amplifier threshold voltage, said sense amplifier means output signal changing from a first to a second logic level in response to said ROM output signal penetrating said sense amplifier means threshold voltage, said sense amplifier means threshold voltage changing in a temperature dependent, voltage source and process dependent relation;

said voltage divider ratio being trimmed to set the ROM drive voltage to adjust the ROM output signal midpoint voltage to substantially equal said sense amplifier threshold voltage;

said drive voltage being characterized to continually adjust said ROM output signal midpoint voltage to remain essentially equivalent to said sense amplifier means threshold voltage in a sense amplifier means threshold voltage temperature dependent, voltage source dependent and process dependent change accommodating relation;

whereby, said ROM being responsive to said drive voltage, adjusts said ROM output signal first and second logic level voltage range to compensate for said sense amplifier means temperature dependent threshold voltage change, thereby improving sense amplifier means ROM output signal logic level detecting margin.

2. The combination of claim 1, wherein said first inverting amplifier further comprises:

a fifth multiterminal semiconductor device having a conduction channel and a control grid, said conduction channel having a first and second terminal, said fifth multiterminal semiconductor device conduction channel first terminal being connected to said voltage source, said fifth multiterminal semiconductor device conduction channel second terminal being connected to said voltage divider network sense terminal, said first inverting amplifier output terminal being connected to said fifth multiterminal semiconductor device control grid;

whereby, said drive circuit drive voltage is adjusted in a sense amplifier means threshold voltage temperature dependent, voltage source dependent and process dependent change accommodating relation.

3. The combination of claim 1, wherein said sense amplifier means further comprises: a second inverting amplifier having an input terminal and an output terminal, said second inverting amplifier input terminal being connected to said sense amplifier means input terminal, said second inverting amplifier output terminal being connected to said sense amplifier means output terminal, said second inverting amplifier having a predetermined threshold voltage, said second inverting amplifier predetermined threshold voltage being initially set in the absence of temperature change, voltage source change and process induced change;

said predetermined threshold voltage being initially adjusted to a value approximating a mid point between said ROM output signal first logic level voltage and said ROM output signal second logic level voltage, said second inverting amplifier predetermined threshold voltage being subject to adverse input signal margin reducing change in response to temperature change, voltage source change or process change;

whereby, said ROM output signal changes in a sense amplifier means threshold voltage temperature dependent, voltage source dependent and process dependent change accommodating relation.

4. The combination of claim 2, wherein said voltage divider network further comprises:

a sixth and seventh multiterminal semiconductor device, each respective multiterminal semiconductor device having a control grid and a conduction channel having a first and second terminal, said sixth multiterminal semiconductor device conduction channel first terminal being connected to said voltage divider network sense terminal, said sixth multiterminal semiconductor device conduction channel second terminal being connected to said sixth multiterminal semiconductor device control grid, said seventh multiterminal semiconductor device conduction channel first terminal and to said voltage reference divider network output terminal, said seventh multiterminal semiconductor device conduction channel second terminal being connected to said seventh multiterminal semiconductor device control grid and to said voltage divider network reference voltage terminal.

5. The combination of claim 3, wherein said second inverting amplifier further comprises:

an eighth, ninth, tenth and eleventh multiterminal semiconductor device, each respective multiterminal semiconductor device having a respective control grid and conduction channel having a first and second terminal, said eighth and eleventh multiterminal semiconductor device conduction channel first terminals eing connected to said voltage source, said eighth multiterminal semiconductor device conduction channel second terminal being connected to said eighth multiterminal semiconductor device control grid, to said ninth multiterminal semiconductor device conduction channel first terminal and to said second inverting amplifier output terminal, said ninth multiterminal semiconductor device conduction channel second terminal being connected to said tenth multiterminal semiconductor device conduction channel first terminal, to said eleventh multiterminal semiconductor device conduction channel second terminal and to said eleventh multiterminal semiconductor device control grid, said ninth multiterminal semiconductor device control grid being connected to said second inverting amplifier input and to said tenth multiterminal semiconductor device control grid, said tenth multiterminal semiconductor device conduction channel second terminal being connected to said reference potential;

whereby, said second inverting amplifier predetermined threshold voltage is subject to adverse sense amplifier means input signal margin reducing change in response to temperature change, voltage source and process dependent change; said ROM output signal midpoint being changed by said drive circuit drive voltage applied to said ROM input terminal in a sense amplifier means threshold voltage temperature dependent, voltage source dependent and process dependent change accommodating relation.

6. The combination of claim 1, wherein said first, third and fifth multiterminal semiconductor devices further comprise depletion mode insuated gate field effect transistors, and wherein said second and said fourth multiterminal semiconductor devices further comprise enhancement mode insulated gate field effect transistors.

7. The combination of claim 5, wherein said eighth and eleventh multiterminal semiconductor devices further comprise depletion mode insulated gate field effect transistors and wherein said ninth and tenth multiterminal semiconductor devices further comprise enhancement mode insulated gate field effect transistors.

8. The combination of claim 7, wherein said first, third and fifth multiterminal semiconductor devices further comprise depletion mode insulated gate field effect transistors, and wherein said second and said fourth multiterminal semiconductor devices further comprise enhancement mode insulated gate field effect transistors.

9. The combination of claim 8, wherein said field effect transistors are n-channel devices, said voltage source is a relatively positive voltage with respect to said reference voltage and wherein said ROM output signal first logic level voltage is relatively positive with respect to said ROM output signal second logic level voltage.

10. A tracking ROM drive and sense circuit formed on a monolithic integrated circuit and operating between a voltage source and a reference potential, such as ground, and being coupled to drive and sense a ROM having a ROM input terminal; and a ROM output terminal, said ROM also having a bias means interposed between said ROM input terminal and said ROM output terminal, and an array of selectable read only memory cells powered by said ROM bias means and operating in parallel between said ROM output terminal and said reference potential, said ROM providing an output signal at said ROM output terminal, said output signal having a first and second logic level voltage, said first and second logic level voltages characterizing a ROM output signal midpoint voltage substantially between said first and second logic levels, said ROM alternately switching said output signal between said logic levels through said ROM output signal midpoint voltage in response to each memory cell selection;

said ROM input terminal receiving a drive voltage, said ROM output signal midpoint voltage being adjusted by adjustment of said drive voltage, said tracking ROM drive and sense circuit comprising:

a drive circuit, said drive circuit having an output terminal coupled to said ROM input terminal, said drive circuit having a first inverting amplifier, having an output terminal connected to said drive circuit output terminal and an input terminal, a voltage divider network, said voltage divider network having a sense terminal, a reference voltage terminal and an output terminal, said voltage divider network sense terminal being connected to said drive circuit output terminal;

said voltage divider network reference voltage terminal being connected to said reference potential, said voltage divider network output terminal being connected to said first inverting amplifier input terminal;

a sense amplifier means having an input terminal coupled to said ROM output terminal for providing an output signal at a sense amplifier means output terminal in response to said ROM output signal at said sense amplifier input terminal penetrating a predetermined sense amplifier threshold voltage, said sense amplifier means output signal changing from a first to a second logic level in response to said ROM output signal penetrating said sense amplifier means threshold voltage, said sense amplifier means threshold voltage changing in a temperature dependent, voltage source and process dependent relation;

said voltage divider ratio being trimmed to set said ROM drive voltage to set said ROM output signal midpoint voltage to substantially equal said sense amplifier threshold voltage;

said sense amplifier means having a second inverting amplifier having an input terminal and an output terminal, said second inverting amplifier input terminal being connected to said sense amplifier means input terminal, said second inverting amplifier output terminal being connected to said sense amplifier means output terminal, said second inverting amplifier having a predetermined threshold voltage, said second inverting amplifier predetermined threshold voltage being initially set in the absence of temperature change, voltage source change and process induced change;

said second inverting amplifier predetermined threshold voltage being initially adjusted to a value approximating a midpoint between said ROM output signal first logic level voltage and said ROM output signal second logic level voltage;

said first inverting amplifier and said second inverting amplifier having substantially identical circuits formed on said monolithic integrated circuit;

whereby, said drive circuit adjusts said ROM drive voltage in response to temperature change to adjust said ROM output signal midpoint voltage to remain substantially equal to said sense amplifier threshold voltage.

* * * * *